United States Patent [19]

Stickney et al.

[11] Patent Number: 5,385,651
[45] Date of Patent: Jan. 31, 1995

[54] DIGITAL ELECTROCHEMICAL ETCHING OF COMPOUND SEMICONDUCTORS

[75] Inventors: John L. Stickney; Qing Lei; Choong K. Rhee, all of Athens, Ga.

[73] Assignee: University of Georgia Research Foundation, Athens, Ga.

[21] Appl. No.: 68,752

[22] Filed: May 28, 1993

Related U.S. Application Data

[63] Continuation-in-part of Ser. No. 695,969, May 6, 1991, Pat. No. 5,320,736, which is a continuation-in-part of Ser. No. 640,597, Jan. 11, 1991, abandoned.

[51] Int. Cl.[6] ............................................. C25F 3/12
[52] U.S. Cl. .......................... 204/129.25; 204/129.3; 437/234
[58] Field of Search .................... 205/223; 204/129.1, 204/129.43, 129.25, 129.3; 437/234

[56] References Cited

U.S. PATENT DOCUMENTS

| | | | |
|---|---|---|---|
| 4,058,430 | 11/1977 | Suntola et al. | 156/611 |
| 4,369,099 | 1/1983 | Kohl et al. | 204/129.3 |
| 4,628,591 | 12/1986 | Zorinsky et al. | 29/576 W |

OTHER PUBLICATIONS

Goodman et al., Atomic Layer Epitaxy, J. Appl. Phys. 60, R65 Aug. 1, 1986.
Kuech et al., Atomic Layer Growth and Processing, Mat. Res. Soc. Proc. 222 (1991).
Gregory et al., Electrochemical Atomic Layer Epitaxy, J. Electroanal. Chem. 300, 543 (1991).
Gregory et al., Conditions for the Deposition of CdTe, J. Electrochem. Soc., 138, 1279 May, 1991.
Suggs et al., Atomic Layer Growth and Processing, Mat. Res. Soc. Proc. 222, 283 (1991).
Kolb, Advances in Electrochemistry and Electrochemical Engineering, vol. 11, 125 (1978).
Juttner et al., Underpotential Metal Deposition on Single Crystal Surfaces, Z. Phys. Chem. N.R. 122, 163 May 24, 1980.
Meguro et al., Digital Etching of GaAs, Appl. Phys. Lett. 56, 1522 Apr. 16, 1990.
Horiike et al., Digital Chemical Vapor Deposition, J. Vac. Sci. Tech. A, 8, 1844 May/Jun. 1990.
Meguro et al., Atomic Layer Growth and Processing, Mat. Res. Soc. Proc. 222, 121 (1991).
Sakave et al., Digital Process for Advanced VLSI's, Mat. Res. Soc. Proc. 222, 195 (1991).
Maki et al., Laser Bilayer Etching of GaAs Surfaces, Appl. Phys. Lett. 55, 91 Jul. 10, 1989.
Pourbaix et al., Cadmium, Atlas of Electrochemical Equilibria in Aqueous Solutions (1966).
Villegas et al., Formation of Ordered, Nonreconstructed CdTe(III), J. Electrochem. Soc. 138, 1310 May, 1991.

*Primary Examiner*—John Niebling
*Assistant Examiner*—Brendan Mee
*Attorney, Agent, or Firm*—Deveau, Colton & Marquis

[57] ABSTRACT

A method for the digital electrochemical etching of compound semiconductors in an electrochemical flow cell system in which alternating electrochemical potentials are applied between a reference electrode and the compound semiconductor sufficient to strip portions, preferably atomic layers, of the elements of compound semiconductors from the compound semiconductors.

7 Claims, 9 Drawing Sheets

Au

Te
Au

Cd
Te
Au

DIGITAL ELECTROCHEMICAL ETCHING OF COMPOUND SEMICONDUCTORS

STATEMENT OF GOVERNMENT INTEREST

This invention was funded in part by the United States National Science Foundation under grant number DMR-9017431 and by the United States Department of the Navy, Office of the Chief of Naval Research, under grant number N00014-91-J-1919. The United States Government may have certain rights to this invention.

STATEMENT OF RELATED APPLICATIONS

This is a continuation-in-part of copending application Ser. No. 07/695,969 filed on May 6, 1991, now U.S. Pat. No. 5,320,736, which was a continuation-in-part of Ser. No. 07/640,597 filed Jan. 11, 1991 now abandoned.

BACKGROUND OF THE INVENTION

1. Field of the Invention

This invention relates generally to methods for the electrochemical digital etching of compound semiconductors comprising alternating layers of a first element and a second element, and relates specifically to a method for the cyclical removal of a bilayer of the compound semiconductor by removing an atomic layer of the first element at a first potential and then removing an atomic layer of the second element at a second potential. The process of the invention can be applied to compound semiconductors produced by the electrochemical atomic layer epitaxy (ECALE) which is the subject matter of copending application Ser. No. 07/695,969, filed on May 6, 1991, now U.S. Pat. No. 5,320,736, which is incorporated herein by this reference, and also can be applied to any compound semiconductor comprising alternating layers of the constituent elements.

2. Prior Art

The trend towards low dimensional materials in the field of electro-optics has resulted in the need for atomic level control of deposit structure and dimensions. The family of techniques referred to as Atomic Layer Epitaxy (ALE) has arisen to help address that need. Finnish Patent No. 52359, U.S. Pat. No. 4,058,430; Goodman, C. H. L. et al., J. Appl. Phys. 60, R65 (1986); Kuech, T. F. et al., *Atomic Layer Growth and Processing*, Mater. Res. Soc. Proc. 222, Pittsburgh, Pa., 1991. The principle of ALE is that atomic layers of individual elements are deposited sequentially. In this way, layer-by-layer growth is maintained and deposit thickness is controlled by the number of deposition cycles, not by the reactant flux.

The present principal inventor has been working on the electrochemical analogue of ALE, referred to as Electrochemical Atomic Layer Epitaxy (ECALE). Stickney, J. L. et al., J. Electroanal. Chem., 300 543 (1991); Stickney, J. L. et al., J. Electrochem. Soc., 138, 1279 (1991); Stickney, J. L. et at., *Atomic Layer Growth and Processing*, edited by Kuech, T. F. et al., Mater. Res. Soc. Proc. 222, Pittsburgh, Pa., 1991, p. 283. ECALE is a method for the formation of compound semiconductors where individual elements are alternately electrodeposited at underpotential from separate solutions. The term underpotential refers to the fact that compound formation is generally energetically favorable, compared with formation of bulk deposits of the individual elements. Kolb, D. M., *Advances in Electrochemistry and Electrochemical Engineering*, Vol. 11, Eds. Gerischer, H. et al., John Wiley; New York, 1978, p. 125; Juttner, K. et al., Z. Phys. Chem. N.R., 122, 163 (1980). Thus, electrodeposition of one element on a second, forming a surface compound, will frequently occur at a potential prior to (under) that required to deposit the bulk element. Deposition is surface limited; limited to an atomic layer, as diffusion of the depositing element into the substrate is generally a slow process at room temperature.

In addition to atomic control over deposition, atomic control over material removal is desirable. Digital etching is just beginning to emerge as an active area of research. Present attempts at digital etching involve cycles where a reactant gas is first absorbed on the substrate surface and then a reaction is initiated using an energetic beam of electrons, ions or photons. Reaction of the monolayer of adsorbed gas occurs only with the surface, forming a volatile compound, and thereby removing one atomic layer of the substrate. Etching involves the repeated application of this cycle. Digital etching is applicable to elemental semiconductors, compound semiconductors and other materials such as metals and insulators.

The above studies involved a single etchant gas and a subsequent reaction initiation. Meguro, T. et al., Appl. Phys. Lett. 56, 1552 (1990); Horiike, Y. et al., J. Vac. Sci. Technol. A, 8, 1844 (1990); Meguro T. et al., *Atomic Layer Growth and Processing*, edited by Kuech, T. F. et al. Mater. Res. Soc. Proc. 222, Pittsburgh, Pa., 1991, p. 121; Sakaue, H. et al., *Atomic Layer Growth and Processing*, edited by Kuech, T. F. et al. Mater. Res. Soc. Proc. 222, Pittsburgh, Pa., 1991, p. 195; Maki P. A. et al., Appl. Phys. Lett., 55, 91 (1989). ALE of compound semiconductors involves the use of different reactant precursors for the deposition of the individual elements. Finnish Patent No. 52359, U.S. Pat. No. 4,058,430, Goodman C. H. L. et al., J. Appl. Phys. 60, R65 (1986); Kuech, T. F. et al., *Atomic Layer Growth and Processing*, Mater. Res. Soc. Proc. 222, Pittsburgh, Pa., 1991. This suggests scenarios for digital etching of compound semiconductors where atomic layers of each of the component elements are removed preferentially using separate etchant species, leaving an atomic layer of the other element. The present specification describes performing digital etching electrochemically on compound semiconductors where electrons are used to remove an atomic layer of one element, and holes are used to remove an atomic layer of the other. This process is a natural outgrowth of ECALE, as again, the underpotentials for the component elements are used, although, in the digital etching process a single electrolyte solution is used, containing no precursors to the substrate's component elements.

BRIEF SUMMARY OF THE INVENTION

The principles for an electrochemical digital etching method for compound semiconductors are disclosed and claimed herein, along with results obtained by practicing the disclosed method. The method is designed to allow atomic level control over the etching process, resulting in the removal of a bilayer of the compound for each cycle. An atomic layer of one element is removed at one potential and then an atomic layer of the second element is removed at a second potential to complete one cycle. The results disclosed herein are for the etching of CdTe, although, as discussed below, other elements are suitable for practicing the disclosed method. For CdTe, Te is stripped by reduction to $Te^{2-}$ while Cd is stripped by oxidation to $Cd^{2+}$. Underpotentials are chosen so that only the top atomic layer of an element is removed. Potentials sufficient to strip the element from the bulk of the CdTe substrate are avoided. Application of the method involves the use of a simple electrochemical cell, with solution convection. The substrate is placed in the cell and a square wave applied, where each cycle results in the dissolution of a bilayer of the compound. The two potentials of the square wave correspond to underpotential stripping potentials for Cd and Te respectively. The disclosed method is applicable to compound semiconductors produced by ECALE, and by other, standard methods.

Accordingly, it is an object of the present invention to provide a method for electrochemically etching compound semiconductors by removing one atomic layer of each element of which the compound semiconductor is comprised per cycle.

It is another object of the present invention to provide a method for electrochemically etching compound semiconductors produced using electrochemical atomic layer epitaxy.

It is a further object of the present invention to provide a method of electrochemically etching compound semiconductors using underpotential stripping of the constituent elements.

Yet another object of the present invention is to provide a method for electrochemically etching compound semiconductors which produces a higher quality etched semiconductor in a relatively more accurate and less costly process.

These objects, and other objects, features, and advantages of the present invention will become apparent to those skilled in the art from the following detailed description of the preferred embodiment when read in conjunction with the accompanying figures.

DETAILED DESCRIPTION OF THE PREFERRED EMBODIMENT

1. ECALE

Figure 1:
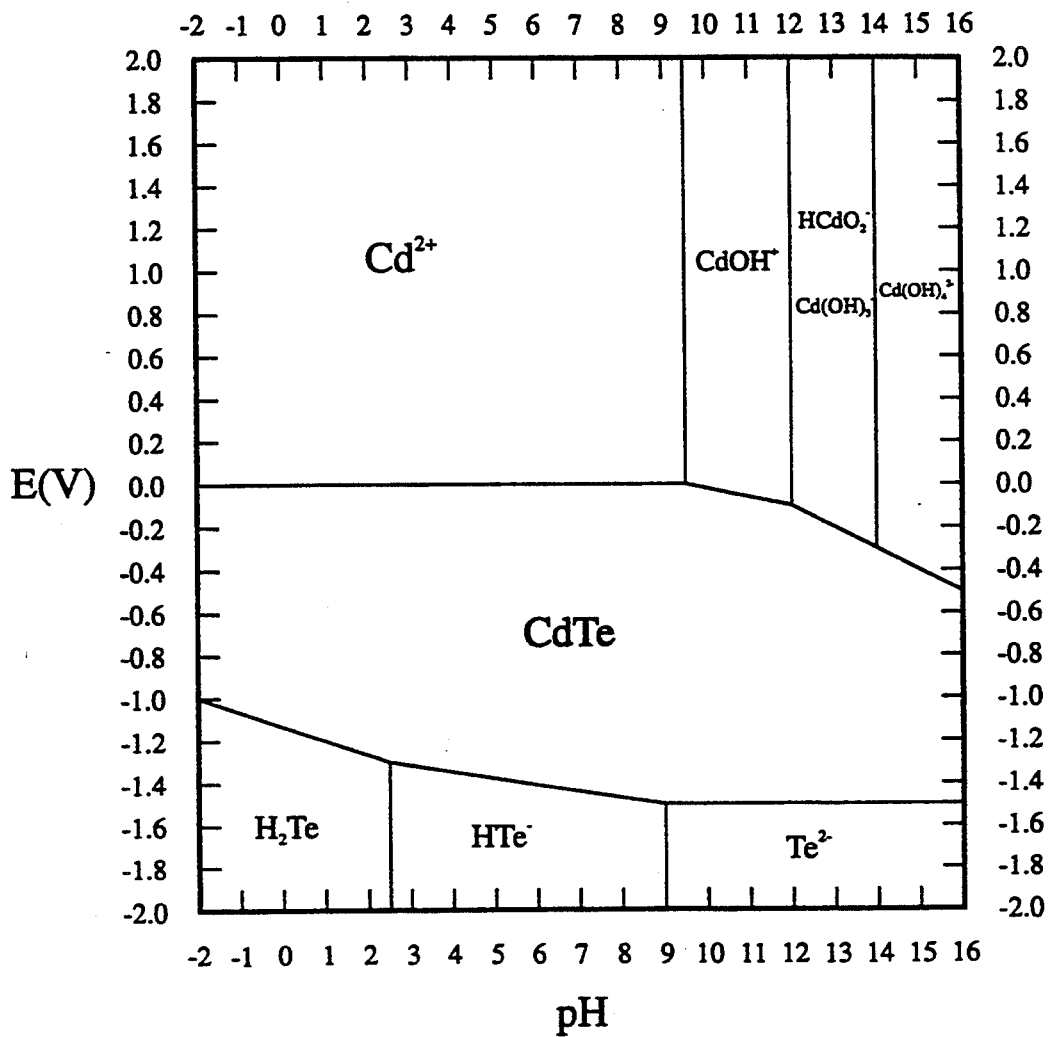
FIG. 1 is a Pourbaix diagram describing the decomposition of CdTe.

ECALE involves the alternated electrochemical deposition of elements to form a compound. Epitaxial deposition is achieved by using underpotential deposition (UPD) as the means to achieve self-limiting growth. The fundamental aspect of ECALE is that the compound is formed one atomic layer at a time. In this way, one component element is deposited only on the previously deposited component element, and no bulk deposition occurs. This selective deposition is facilitated by the energetics of forming a compound, the heat of formation, where the compound is more stable than the bulk elements themselves. If compound formation is thermodynamically favored, UPD potentials generally exist for which one element of the compound will deposit more easily on the second element than on itself. In the formation of compounds by the ECALE method, the underlying factor controlling reactivity is the electrode potential, which allows the compound to be formed spontaneously during the electrodeposition process, an atomic layer at a time.

ECALE is the electrochemical analog of atomic layer epitaxy (ALE) and is based on the alternated electrodeposition of atomic layers of two elements at underpotential in order to form a compound. The basic premise of ALE is that individual components are delivered to a substrate, such as the compound semiconductor, separately, and in a surface-limited reaction, only a single atomic layer of each element is formed on the substrate at a time. Any quantity of each element greater than a single atomic layer remaining on the substrate is then flushed or pumped away. UPD is used in the ECALE method for the deposition of both of the elements composing a compound. Most compound semiconductors consist of a metal and a main group element, such as Tellurium, Selenium, Sulfur, Germanium, Tin, Lead, Arsenic, Antimony, or Bismuth. The main group elements listed above form oxidized species which are soluble but, unlike most transition metals, also form soluble reduced species, such as $Te^{2-}$, $Se^{2-}$, $S^{2-}$, $Ge^{4-}$, $Sn^{4-}$, $Pb^{2-}$, $As^{3-}$, $Sb^{3-}$, and $Bi^{3-}$ which are amenable to oxidative deposition of the element, and to oxidative UPD.

The phenomena of UPD involves the deposition of one element onto a second element at a potential prior to (under) that required for deposition of the first element on itself. Classically, UPD involves the reductive deposition of a less noble metal onto a more noble metal. The driving force for UPD is formation of a compound which is energetically favored relative to the bulk elements with a stoichiometry defined by the surface chemistry of the substrate or deposit. With metals, two-dimensional bimetallic compounds are formed. This driving force can also come from formation of other types of compounds. UPD can refer to processes such as the adsorption of hydrogen on a metal, as in the hydrogen waves on Pt, or anodic processes such as the initial stages of oxide formation on metals, or halogen deposition on a metal from a halide solution.

ECALE is novel in its use of separate solutions for the electrodeposition of atomic layers of each element, or reactant. Solutions containing a single reactant are exposed to the deposit surface or substrate for a time sufficient to equilibrate. The substrate is exposed to the solution at a potential where UPD of the element occurs to form the compound, with the exclusion of bulk deposition. Therefore, the solution composition for each reactant may be chosen to optimize the deposition of the component element contained in the solution.

Deposition is referred to herein in terms of atomic layers, wherein, for example, an atomic layer of the Group IIB component and an atomic layer of the Group VIA component would be combined to form a full monolayer of a Group II/Group VI compound. The use of the designation, or nomenclature, atomic layer is used to represent all layers which are one atom in thickness. These layers can have a variety of coverages or packing densities (atoms/cm$^2$). A full monolayer would be defined relative to the number of surface atoms per cm$^2$ of the substrate. In other words, a full monolayer results when there is one deposited atom for every substrate surface atom. For example, in the formation of a compound such as CdTe, deposition of a full monolayer of Cd or Te would be excessive, and would result in some bulk formation, thereby being over an atom thick. The formation of a single non-reconstructive layer of CdTe on a gold substrate would require atomic layers corresponding to coverages of about one-half of a monolayer of Te and about one-half of a monolayer of Cd. Therefore, depositing a full monolayer of Te would result in twice as much Te as necessary. The use of the designation, or nomenclature, monolayer when referring to the compound semiconductor of the present invention is used to represent two successively deposited atomic layers of alternate elements.

Compounds can be formed by sequentially depositing a Group VIA atomic layer followed by a Group IIB atomic layer. A thin-layer electrochemical (TLE) cell configuration may be used for the deposition so that solutions are easily changed by blowing out one solution and allowing a second to flush in by capillary action. This process is referred to as a "rinse." The use of two different reactant solutions, and a pure electrolyte to rinse with inbetween, avoids complications present with codeposition of the elements and allows a single reactant species to be deposited at a time. Those problems encountered with codeposition methods are associated with having to keep both species in the solution, which puts constraints on what electrolytes, complexing agents, and pH values the solutions can have. To limit the reactivity to an atomic layer at a time, deposition potentials are selected for UPD. This process avoids formation of three-dimensional crystallites and Stranski-Krastanov growth.

A wide variety of electrode substrates may be used in ECALE, depending on the elements selected to be deposited. The electrodes may be composed of any material that is stable at the potentials used for deposition of the compound. The various substrates appropriate for different semiconductor elements are known in the field of thin-film fabrication and in the electronics industry. A brief list of suitable materials, which is by no means exclusive, includes gold, copper, silver, platinum, various compound semiconductors, carbon, and less noble metals. In some instances a rough metal surface substrate will be needed, in others a smooth surface will be needed, while in still others a substrate which is lattice-matched with the semiconductor deposit, such as another semiconductor, will be required. In any event, the nature of the substrate will be particular to the deposited semiconductor compound, the desired compound structure and the desired structure of the resulting device being fabricated. In other words, for any given semiconductor compound, the end use will dictate the substrate used. For example, in the case of solar cells, polycrystalline deposits are tolerable and thus rougher substrates are suitable. However, in the case of electronic grade semiconductor thin films, lattice-matched substrates and state-of-the-art surface treatments must be used.

Regarding the specific materials used in ECALE, various solvents, gases and electrolytes may be used. For example, although water is a preferred solvent, nonaqueous solvents may be desirable depending on the reactant element involved. Gases used for solution purging or for delivering reactant solutions to the substrate should be inert, and include, for example, nitrogen and the noble gases, such as helium, neon, argon, krypton, and xenon. Gases which are used as reactant gases include the hydrides of the Group IV and VI elements, such as $H_2Te$, $H_2Se$, $H_2S$, $H_3As$, $H_3Sb$ and $H_3P$, which might be dissolved in a solvent so as to be used as reactants.

Any electrolyte that will work with the reactant elements can be used. As each element is deposited from a different solution, the choice of electrolyte is a function of what pH is desired, what solvent is used, and what electrolyte is compatible with the reactant element. For example, when using an aqueous solvent, electrolytes such as any sulfate, borate, nitrate, chloride, bromide or iodide salt, with cations such as $H^+$, $Na^+$, $Li^+$, $K^+$, $Rb^+$ or $Cs^+$, should work, as well as various other electrolytes compatible with the particular reactant elements.

Figure 6:
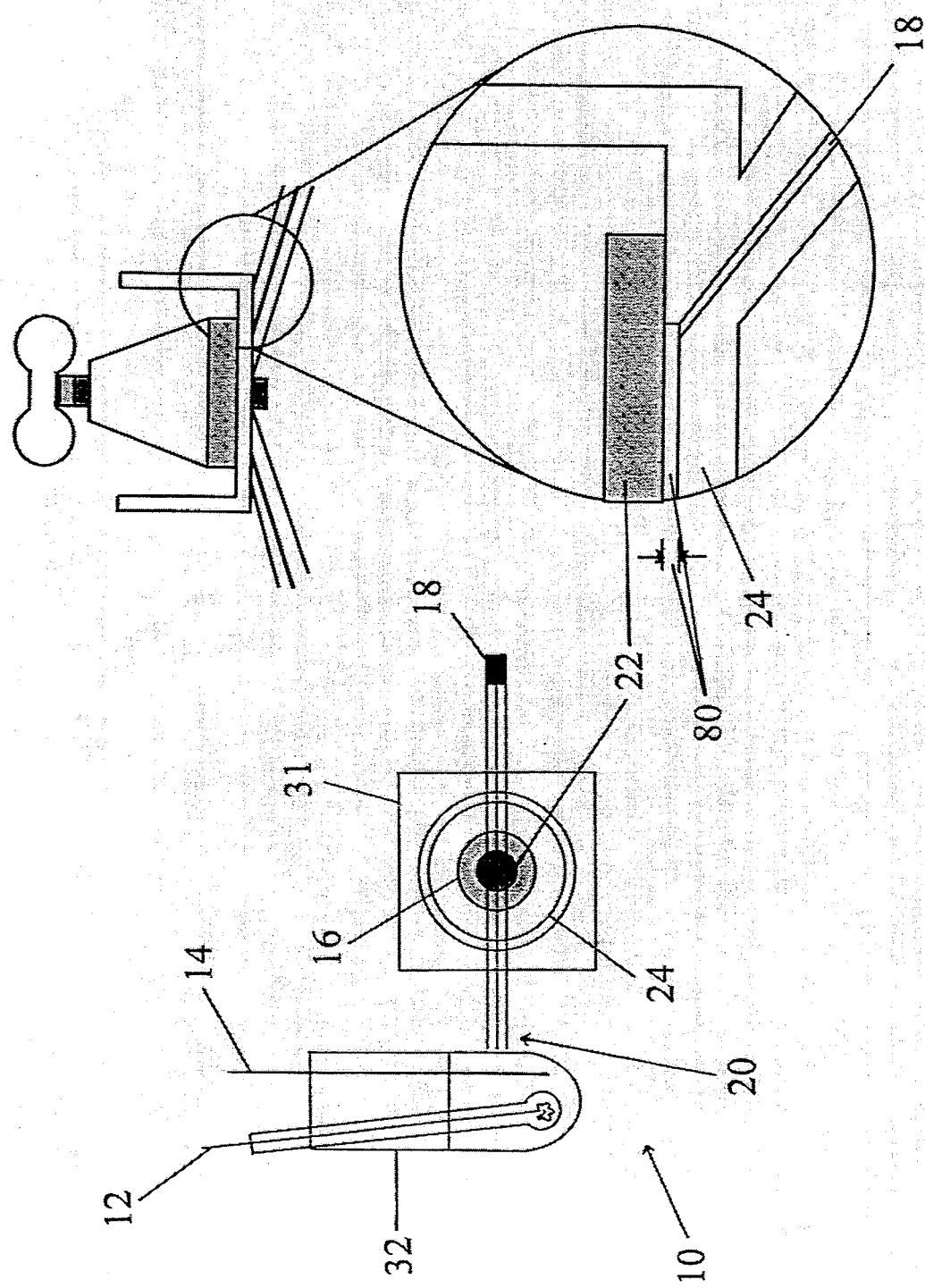
FIG. 6 is a diagram of one electrochemical flow cell which is suitable for use in producing the semiconductor to be etched in the process of the present invention.

An electrochemical flow cell system 10, such as shown in FIG. 6, can be used to produce an ECALE compound semiconductor which can be etched using the process disclosed herein. As discussed below, ECALE compound semiconductors are but one substrate which can be etched using the present method. Single crystals of the semiconductor compounds also can be etched using the present method, resulting in high-quality etching. The ECALE compound semiconductor, having alternating atomic layers of different elements, is described in this embodiment because of the ease of describing by example the removal of the atomic layers of each element. Atomic layers of single crystals, and other substrate materials, also can be accomplished in a similar manner. The flow cell system 10 comprises two sections, a layering cell 28 and a reference electrode compartment 32, connected in series in the line of solution flow. The reference electrode compartment 32 contains the reference electrode 12 and an auxiliary electrode 14. The thin layering cell 28 contains the substrate 22 onto which deposition by the ECALE method will occur.

Referring now to FIGS. 4 and 6, in operation, potentials are applied between the substrate 22 and the reference electrode 12. The pure substrate 22, in this example Gold, is shown in FIG. 4a. A first reactant solution is introduced to the cell 28 through inlet 18. As the first reactant solution enters solution gap 80, it comes into contact with the substrate 22. The first reactant solution exits the cell via outlet 20 and moves into the reference electrode compartment 32, contacting the reference electrode 12, thus allowing control of the substrate 22 potential. The potential difference between the substrate 22 and the reference electrode 12 causes an atomic layer of the first reactant element contained within the first reactant solution to electrochemically deposit on the substrate, as shown in FIG. 4b. After a layer of the first reactant element has been deposited on the substrate, the first reactant solution is pushed out of the cell 28 either by a pure electrolyte solution rinse or by the second reactant solution. It is preferable to use a pure electrolyte rinse to remove the first reactant solution so that the second reactant solution is not contaminated by the first reactant solution.

Figure 4A:
FIGS. 4a, 4b, 4c, 4d, 4e and 4f are a sequence of illustrations of the creation of a compound semiconductor using ECALE.
Figure 4B:
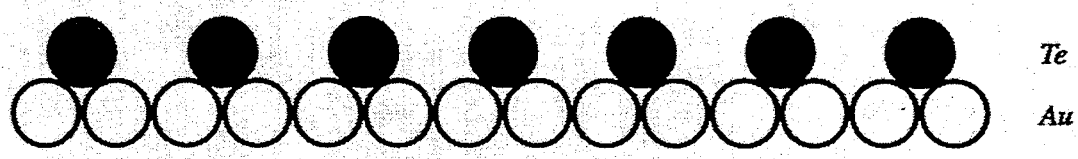
Figure 4C:
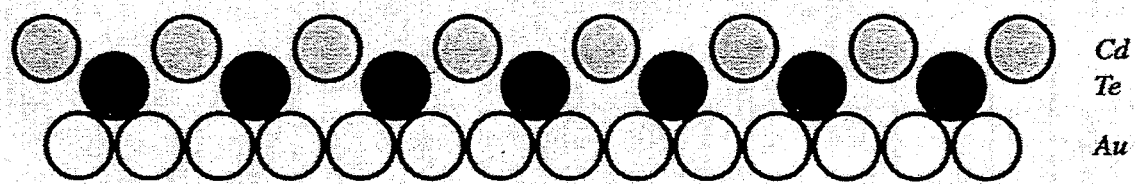
Figure 4D:
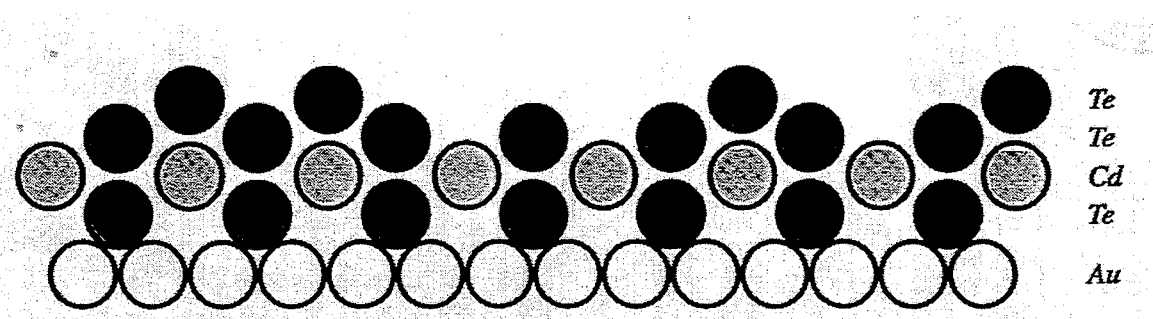
Figure 4E:
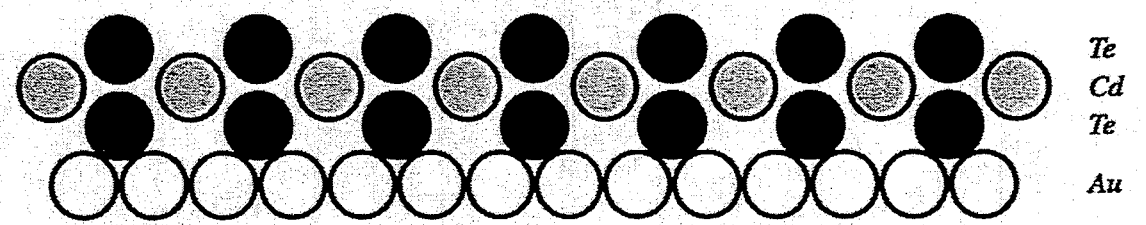
Figure 4F:
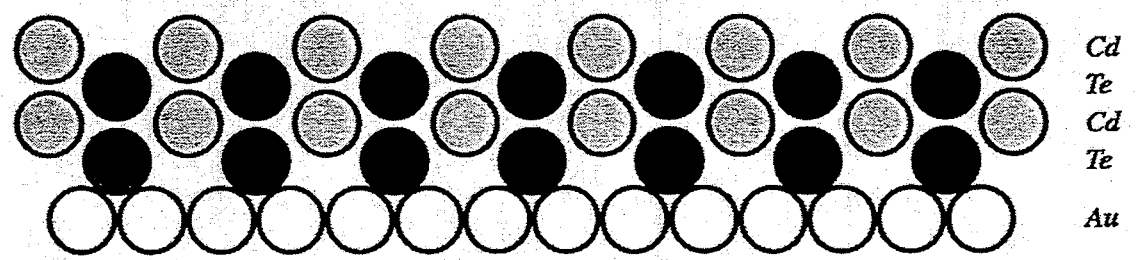
Figure 5A:
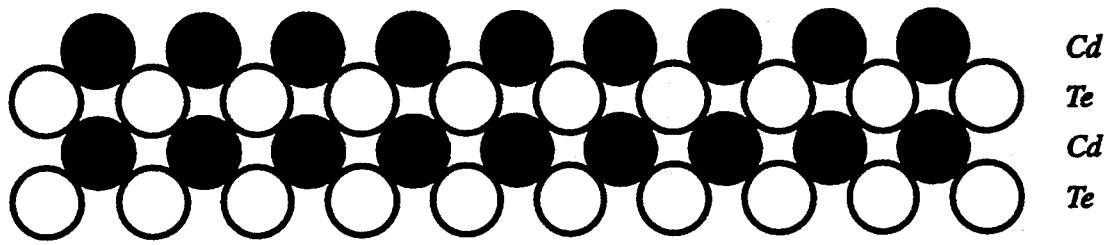
FIGS. 5a, 5b, 5c, 5d and 5e are a sequence of illustrations of the digital electrochemical etchanting of the compound semiconductor created by ECALE and as shown in FIG. 4f to create the etched compound semiconductor of the present invention.
Figure 5B:
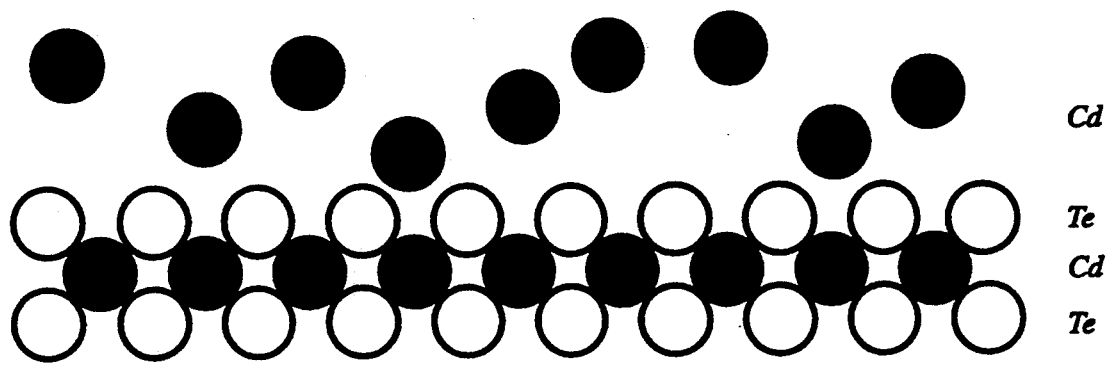
Figure 5C:
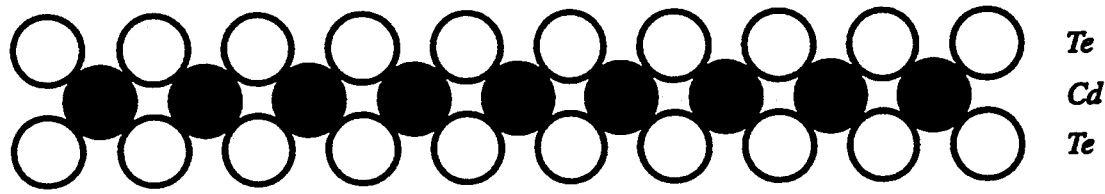
Figure 5D:
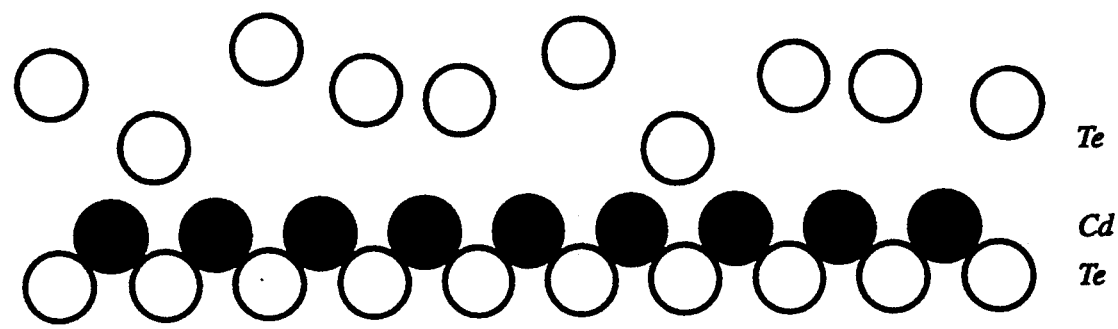
Figure 5E:
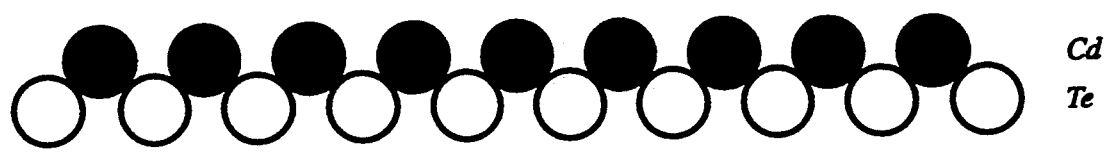

After the first reactant solution has been pushed out of the cell 28, the solution containing a second reactant element is introduced to the cell 28 in the same manner as the first reactant solution discussed above. A second potential is applied between the substrate 22 and the reference electrode 12 causing an atomic layer of the second reactant element to be electrodeposited on top of the previously electrodeposited first reactant element on the substrate 22, as shown in FIG. 4c. This process is repeated any number of times alternating between reactant solutions so as to deposit alternate atomic layers of reactant element, as shown in FIGS. 4d-f. Excess element deposited creating more than an atomic layer, such as shown in FIG. 4d, can be rinsed off by a pure electrolyte solution rinse to leave only an atomic layer of the reactant, as shown in FIG. 4e. In this manner, the alternated electrodeposition of atomic layers of two elements at underpotential in order to form a compound is achieved. The amount of each element deposited is determined by the potential, and is chosen so that a UPD amount results. In general, the two elements to be electrodeposited are selected, one usually a metal and the other from VA, VIA or IV groups: Te, Se, S, Ge, Sn, Pb, As, Sb, or Bi. The amount of the second element deposited corresponds to the amount of the first element deposited. In other words, if 2/5 monolayer of the first element is deposited, 2/5 monolayer of the second element is deposited. This occurs as a natural phenomenon or consequence since the second element attaches only to sites corresponding to the first element. Therefore, after the layer coverage is determined by selection of the deposition potential for the first element, each successive layer will have an equivalent coverage. Alternate layers of the first and second elements are deposited until a film of the desired thickness for the compound semiconductor film is achieved.

2. COMPOUND SEMICONDUCTORS

Compound semiconductors can be produced using their natural tendency to form; electrochemically, UPD is the result of this tendency. ECALE allows compound materials to be synthesized electrochemically one atomic layer at a time. This method of deposition should avoid the formation of three-dimensional nuclei, and the resulting polycrystalline deposits, by never exceeding the monolayer regime. The potentials are controlled such that only deposition sufficient to cover the deposit occurs and bulk elemental growth is prevented. Each successive element only combines with the previous element deposited, which therefore prevents the buildup on any one element. As a result, CdTe three-dimensional nucleation phenomena encountered with the codeposition of Cd and Te is prevented.

The configuration for the electrochemical cell reduces the volumes of solutions exposed to the electrode at a given time, which thus results in significantly less contamination. The adsorption of surface-active contaminants present in the solution can easily result in a monolayer of contamination, which may disrupt epitaxial deposition if a sufficient amount of the contaminant is present. The configuration also facilitates the rapid and complete exchange of solutions.

Single-crystalline epitaxial deposits of compound semiconductors can be formed by electrodeposition. The UPD-assisted alternated electrodeposition of the component elements (ECALE) facilitates the formation of these deposits. Use of single-crystal substrates is desirable for high quality deposits. Compounds such as CdTe, CdS, and CdSe, as well as alloys of these materials, are producible by the ECALE method. Other materials such as the III-V semiconductors and II-VI compounds of Zn and Hg, as well as IV-VI-, II-V, V-VI, and III-VI compounds, can be formed by the ECALE method.

3. ETCHING PROCESS

The electrochemical etching of compound semiconductors disclosed herein is similar to ECALE, but with generally the reverse steps, and is applicable to compound semiconductors. Although the TLE cell and process described above is suitable for the method disclosed herein, it is not the only apparatus and process which are suitable. The preferred embodiment will be described using a CdTe compound semiconductor, although other compound semiconductors, as disclosed above, are suitable.

FIG. 1 is a diagram indicating the potentials for the decomposition of CdTe and the species formed in aqueous solutions as a function of pH and potential. It is essentially a Pourbaix diagram. The shaded region of the diagram indicates areas where CdTe is stable. The initial decomposition of CdTe at positive potentials results in loss of Cd as a $Cd^{2+}$ species, dependent on the solution pH, while decomposition at negative potentials results in the formation of telluride ion. The hatched regions in the diagram represent the difference between the potentials for dissolution of the bulk element and decomposition of CdTe. The hatched regions in essence represent the underpotentials for the elements.

The diagram in FIG. 1 assumes an activity of 1 for the CdTe and $10^{-3}M$ for all soluble species. All potentials in the diagram are versus the SHE reference electrode. These conditions are most applicable for a stoichiometric surface. Given a stoichiometric surface, the digital etching process can begin by dissolution either of Cd or Te. Starting with dissolution of Cd, selection of a potential in the upper hatched region of FIG. 1 will result in dissolution of Cd bulk but not Cd present in CdTe. By choosing a Cd stripping potential closer to the CdTe stripping line (a more positive potential) more Cd will be depleted from the CdTe surface. Potential selection for the stripping of Cd is a critical step in optimizing the digital etching process. Ideally, the potential will be selected sufficiently close to the upper CdTe decomposition potential to result in removal of the top atomic layer of Cd, leaving a full atomic layer of Te. No further Cd removal should occur as the remaining Cd atoms are more highly coordinated to Te atoms. The Te stripping potential would then be selected close to the lower CdTe decomposition potential in order to remove the Te atomic layer, leaving a Cd atomic layer. No further Te removal should occur as the remaining Te atoms are bound to Cd atoms.

Digital electrochemical etching of CdTe involves applying a square wave where one potential is selected sufficiently negative so as to reduce the top layer of Te atoms, yet positive enough that Te atoms are not stripped from sites that have a full complement of Cd bonds. The other potential is selected sufficiently positive to oxidize the top atomic layer of Cd atoms, yet negative enough so that Cd atoms that have a full complement of Te bonds do not strip out. Etching then consists of application of this square wave with a period long enough for complete dissolution of the respective elements. Active mass transfer (flow of the electrolyte over the surface) is applied in order to remove the product ions. Each cycle ideally removes a single CdTe bilayer. This square wave period is a function of the kinetics of the dissolution reaction and the rate of electrolyte flow. If the flow is too slow, some ions, still in the diffuse layer, will redeposit with the change in potential in the subsequent half cycle.

A thin layer electrochemical flow cell (TLE) as described above may be used, as it allows better quantification of the dissolved amounts. While TLE is a good design for carrying out the present process, it is by no means the only flow cell suitable. The preferred flow cell is a thin layer electrochemical cell because of the better quantification; however, a thick layer flow cell having good convection, or a hydrodynamic cell where the electrolyte is continuously exchanged, may be considered preferred or optimal by some of those skilled in the art because thick layer cells avoid some of the complexities of operation of thin layer cells.

Figure 2A:
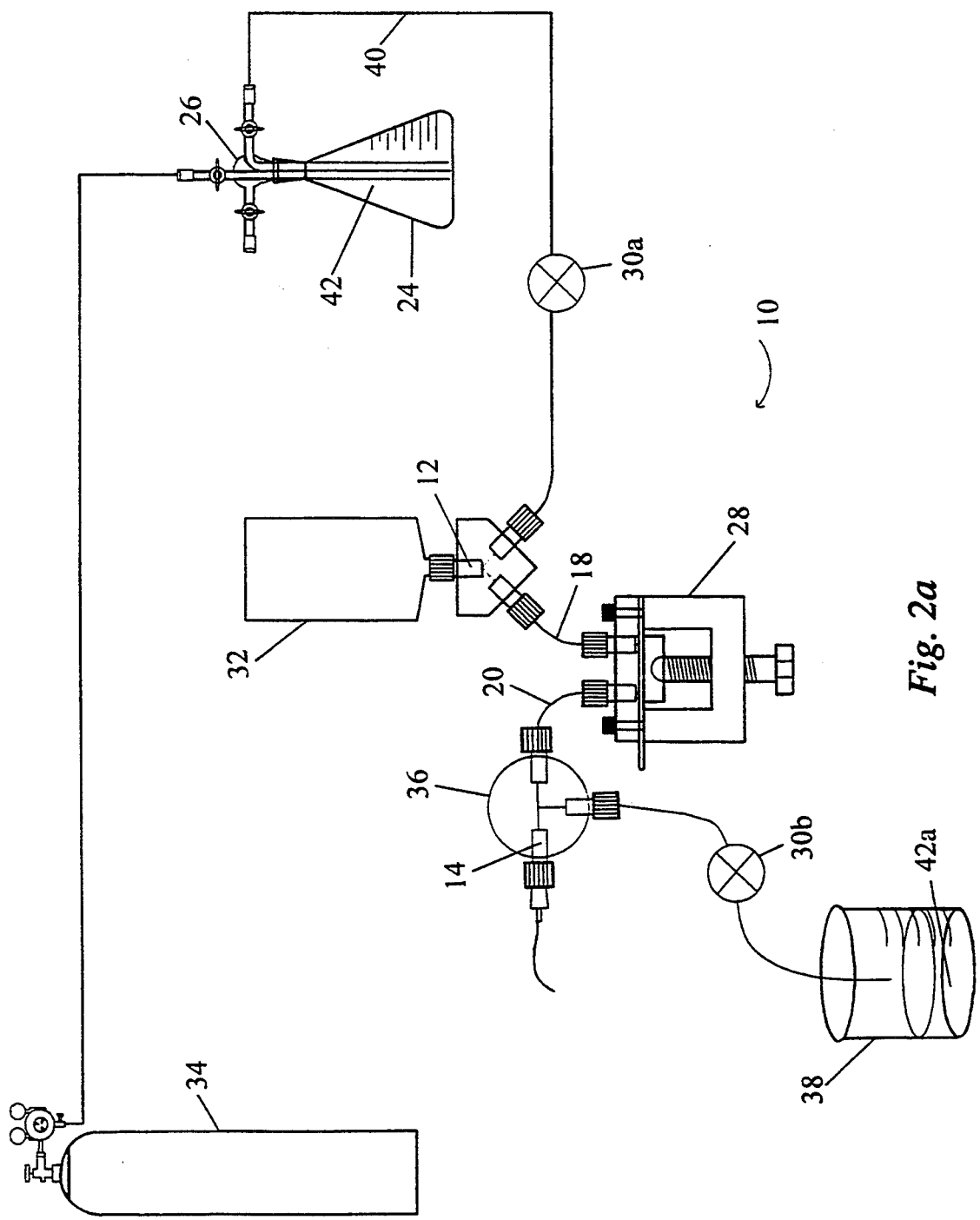
FIG. 2a is a diagram of the electrochemical flow cell developed for and used in the process of the present invention.
Figure 2B:
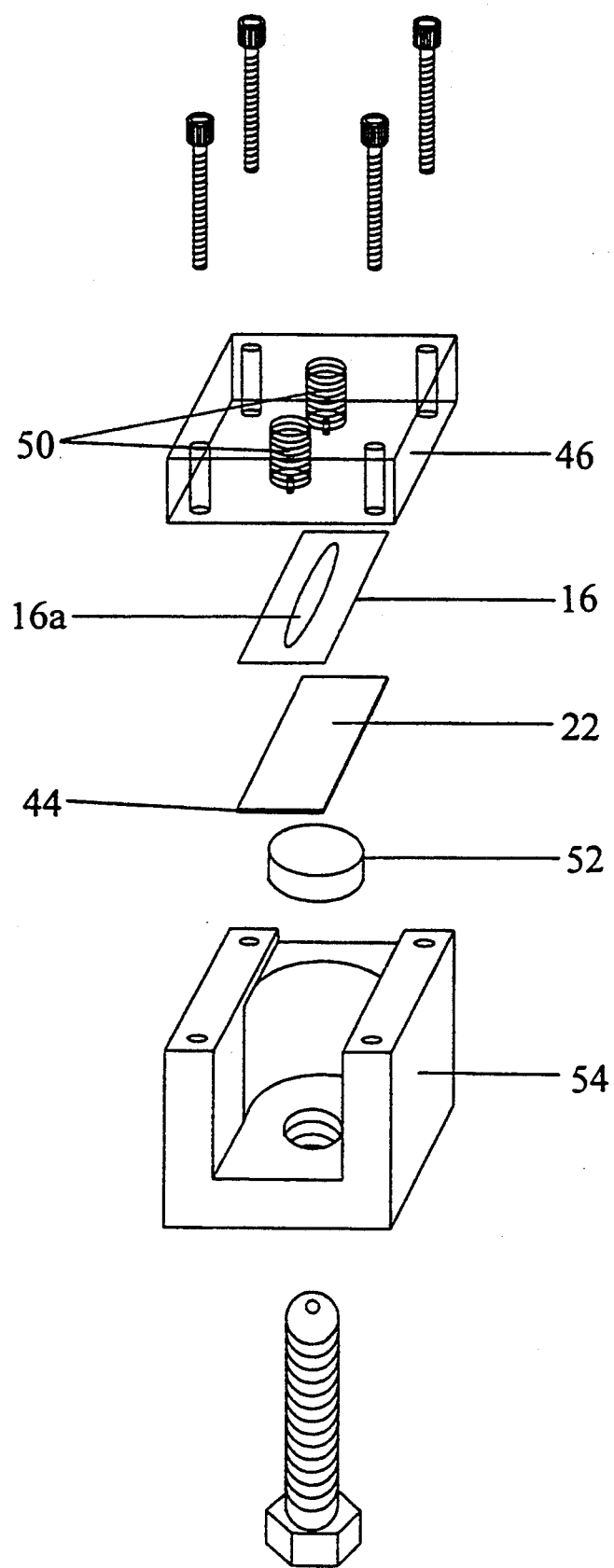
FIG. 2b is a diagram of the etching cell in greater detail.

FIG. 2 is a schematic drawing of the experimental setup. The flow cell system 10 comprises a gas reservoir containing an inert gas 34 under pressure, an electrolyte solution reservoir 24 containing an electrolyte solution 42, a reference electrode compartment 32 containing a reference electrode 12, an electrochemical etching cell 28 containing a compound semiconductor 22 to be etched, in this embodiment a CdTe single crystal, an auxiliary electrode compartment 36 containing an auxiliary electrode 14, and a waste container 38 for collecting the used electrolyte solution 42a.

The inert gas 34 is admitted to the system 10, specifically to the electrolyte solution reservoir 24, through valve 26. The higher pressure of the inert gas 34 forces the electrolyte solution 42 through connecting tubing 40 into reference electrode compartment 32 where electrolyte solution 42 contacts reference electrode 12. Valve 30a and the pressure of inert gas 34 may be used to regulate the flow rate of electrolyte solution 42 through the system 10. The electrolyte solution 42 next enters etching cell 28 through inlet 18. The layering cell comprises a CdTe single crystal 22 sandwiched between an optional piece of Au foil (not shown) and a Teflon gasket 16. On top of the Teflon gasket 16 is a Plexiglass plate 46. Contact to the CdTe crystal 22 is made using an In contact 44, annealed on the back side. Electrical contact of the crystal 22 to the In 44 may be enhanced using the Au foil by pressing the crystal 22 against the Au foil.

The electrolyte solution 42 exits the etching cell 28 through outlet 20 and enters auxiliary electrode compartment 36 where electrolyte solution 42 contacts auxiliary electrode 14. The electrolyte solution 42 exits auxiliary electrode compartment 36 and is collected in waste container 38 as used electrolyte solution 42a. Valve 30b can be used to regulate or stop flow of the electrolyte solution 42 through the etching cell 28. Preferably, the electrolyte solution 42 flows at a constant rate through the system 10. In this regard, it is important that electrolyte solution reservoir 24 be large enough, or be constantly refilled, to maintain electrolyte solution 42 within the system 10. At a minimum, enough electrolyte solution 42 must be contained within reference electrode compartment 32, tubing 40 and etching cell 28 so that reference electrode 12 and compound semiconductor 22 are in electrochemical communication with each other through electrolyte solution 42. Auxiliary electrode 14 also can be used to create the electrochemical potentials. An electrochemical potential can be maintained between compound semiconductor 22 and the reference electrode 12.

An ellipse cut 16a in the Teflon gasket 16 serves as a channel for the flow of electrolyte solution 42. The electrolyte solution 42, delivered from pressurized solution reservoir 24, travels through inlets in the Plexiglass plate 18 of the cell 10. The flow rate is further controlled using the gas pressure and a needle valve 26 on the outlet of the solution reservoir 24. Flow through the cell 10 is turned on and off using valves 30 at the entrance and exit to the cell 10. By stopping the flow, the amounts of ionic species produced in the various etching steps can be investigated coulometrically. That is, once stripped, $Cd^{2+}$ or $Te^{2-}$ can then be quantified from their subsequent redeposition. Alternatively, the resulting ions can be quantitatively removed by flushing the cell 10 with the electrolyte solution 42. To etch the surface of the crystal 22, the electrolyte solution 42 is kept flowing; stopping flow is only performed in the present examples for analytical purposes. As previously mentioned, gas 34, preferably a noble gas or other nonreactive gas, is used to maintain the electrolyte solution 42 at a pressure sufficient to force flow through the cell 10. The gas 34 also functions to remove oxygen from the electrolyte solution 42.

Referring now to FIGS. 2 and 5, in operation, potentials are applied between the compound semiconductor 22 and the reference electrode 12. The compound semiconductor 22 in this example is comprised of alternating layers of Te and Cd, as shown in FIG. 5a. The system 10 is filled with electrolyte solution 42 flowing at a preselected flow rate in the direction from electrolyte solution reservoir 24 to waste container 38. A first electrochemical potential is applied across reference electrode 12 and compound semiconductor 22 sufficient to cause the oxidation of the first semiconductor element, Cd, and subsequent stripping or etching of the oxidized Cd, $Cd^{2+}$, from the compound semiconductor 22, as shown in FIG. 5b. The $Cd^{2+}$ ions, now contained in electrolyte solution 22, are rinsed from the etching cell 28, as shown in FIG. 5c, to waste container 38. A second electrochemical potential is applied across reference electrode 12 and compound semiconductor 22 sufficient to cause the reduction of the second element, Te, and subsequent stripping or etching of the reduced Te, $Te^{2-}$, from the compound semiconductor 22, as shown in FIG. 5d. The $Te^{2-}$ ions, now contained in electrolyte solution 22, are rinsed from the etching cell 28, as shown in FIG. 5c, to waste container 38. The first and second electrochemical potentials may be applied sequentially until the desired etch is obtained on the compound semiconductor 22.

As an optional step, the compound semiconductor can be subjected to a pretreatment. Initial pretreatment, if desired, consists of a 1% Br-methanol etch of the CdTe single crystal sample. The Br-methanol etch results in preferential etching of the Cd and leaves a thin layer of elemental Te on the surface of the CdTe. The Te layer is subsequently removed by electrochemical reduction to telluride ion. The surfaces resulting from this procedure have the simple unreconstructed structure, in the case of the (111) planes of CdTe. That is, simple (1×1) LEED patterns were observed on both the A and B faces of a CdTe (111) single crystal after etching and the electrochemical reduction of excess Te. Alternative pretreatments, such as ion bombardment followed by annealing, generally result in reconstructed or nonstoichiometric surfaces.

Figure 3:
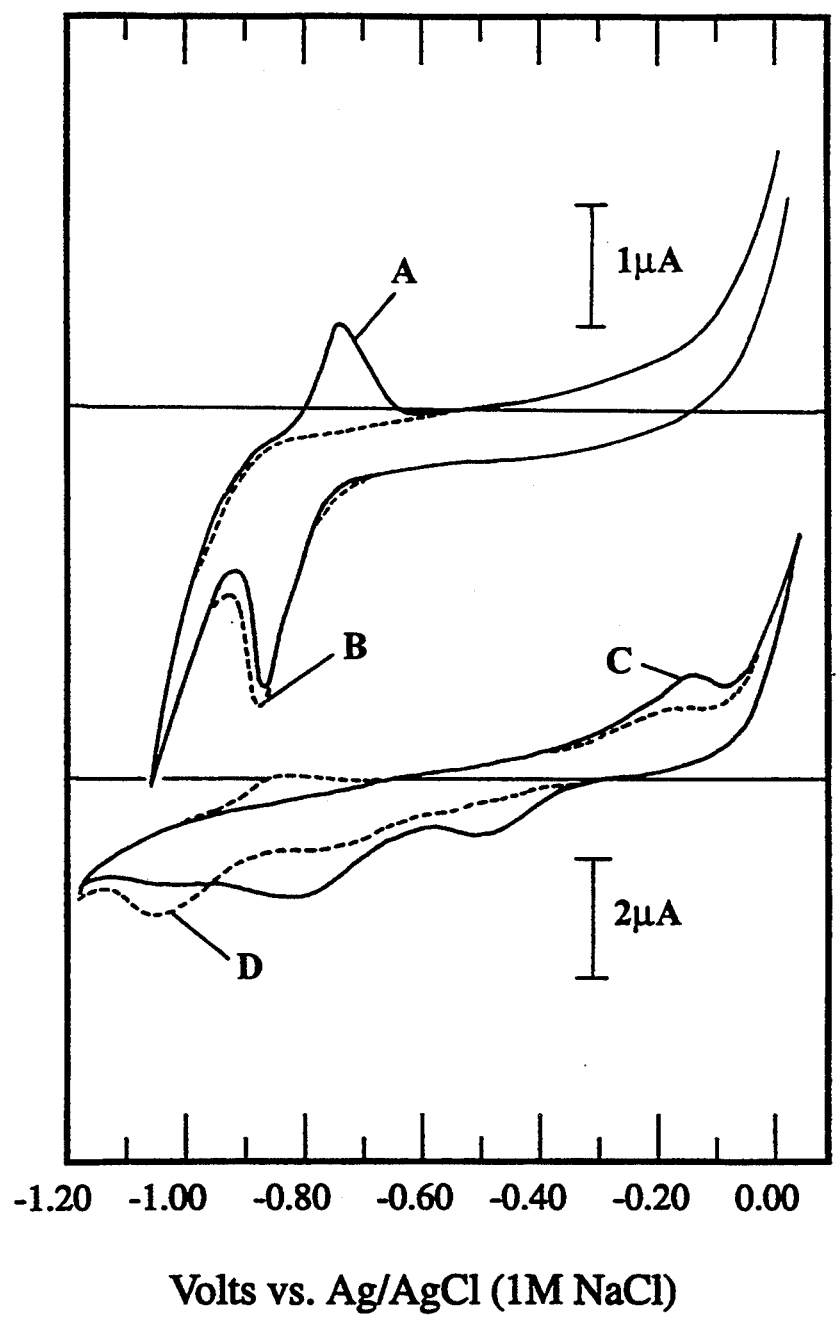
FIG. 3 is a graph of the voltammetry of a CdTe single crystal in volts vs. Ag/AgCl (1M NaCl) is a solution of 0.01M $Na_2B_4O_7$ and 0.5 m $Na_2SO_4$, run at 5 mV/sec.

FIG. 3 is a series of voltammograms taken with the TLE flow cell depicted in FIG. 2. The voltages shown in FIG. 3 are referenced to the Ag/AgCl (1M NACl) reference electrode. FIG. 3, line A was run on the clean CdTe crystal, starting at 0.0 V. This initial potential is sufficient to oxidize multiple atomic layers of Cd. The removal of multiple layers of Cd results in formation of several layers of bulk Te. This was done in FIG. 3, line A and line B to accentuate the Te stripping features. To remove the $Cd^{2+}$ ions formed at potentials above $-0.2$ V, the initial part of the scan was run with the electrolyte flowing. At $-0.2$ V the flow was stopped. The absence of any reduction peaks until $-0.9$ V indicates that all the $Cd^{2+}$ ions were quantitatively removed. The reduction peak for Te to $Te^{2-}$ ($-0.9$ V) and the subsequent oxidation peak for $Te^{2+}$ to Te ($-0.8$ V), in the positive going scan, are clearly evident in FIG. 3 line A. As mentioned above, the size of the peaks are a function of the amount of Cd stripped at potentials above $-0.2$ V. In this case, approximately 5 atomic layers of Cd had been removed and this is reflected in the size of the resulting Te stripping.

FIG. 3, line B was run right after FIG. 3, line A and differs only in that the TLE cavity was rinsed continuously during the negative going scan, until the direction was changed at $-1.1$ V. This resulted in the removal of all $Te^{2-}$ ions formed. The subsequent $Te^{2-}$ oxidation ($-0.8$ V) was thus absent from the positive going scan. Experiments where the positive going scan was subsequently reversed at $-0.5$ V and scanned back through $-0.9$ V indicated no significant Te reduction. Only Te from which the Cd has been stripped (at potentials above $-0.2$ V) could be reduced at $-0.9$ V, and that $Te^{2-}$ had been previously removed during the initial reduction scan with the solution flowing. Subsequent Te reduction would require a still more negative potential, as the remaining Te was stabilized by bonds to Cd. The reduction current observed negative of $-1.0$ V (FIG. 3) is due mostly to the hydrogen evolution reaction at this pH. The hydrogen evolution reaction depolarizes the electrode, limiting further Te reduction.

The lower two cycles FIG. 3 lines C and D, illustrate the Cd dissolution reaction. FIG. 3, line C involves the initial dissolution of Cd at potentials in excess of 0.0 V. The solution is kept flowing until $-0.28$ V, so that $Cd^{2+}$ ions are flushed from the cell. The Te reduction process at $-1.0$ V and the subsequent $Te^{2-}$ oxidation peak are both present in FIG. 3, line C. The changes in peak positions are probably the result of contact resistance changes from FIG. 3 lines A and B, and changes in the IR drop in the TLE cavity, as FIG. 3 lines C and D run with a different CdTe sample. A small peak at $-0.1$ V on the subsequent oxidative scan is visible as well and corresponds to the dissolution of bulk Cd: Cd is not stabilized by the presence of Te. In FIG. 3d the $Cd^{2+}$ produced during the oxidative scan was not rinsed from the cavity and thus its rereduction is visible in two peaks at $-0.5$ V and $-0.8$ V. The first $Cd^{2+}$ reduction peak is due to UPD, or the deposition of $Cd^{2+}$ on the exposed Te. The second peak is due to deposition of bulk Cd and its size is a function of the amount or $Cd^{2+}$ formed at anodic potentials. A small amount of Te reduction is also visible at $-1.0$ V, but as most of the Te was covered by the depositing Cd, the peak is considerably smaller than the equivalent scan, FIG. 3, line C , where all the $Cd^{2+}$ was rinsed away. The cell was rinsed with electrolyte at $-1.2$ V (FIG. 3d) to remove any $Te^{2-}$ formed, and the absence of the $Te^{2-}$ oxidation peak at $-0.8$ is clear. The size of the $Cd^{2+}$ reduction feature in FIG. 3, line D at $-0.8$ V indicates that a significant amount of bulk Cd was formed on the surface, and this is reflected in the subsequent oxidation feature at $-0.1$ V. The increase in the size of this peak, over that in FIG. 3, line C indicates the increased bulk Cd coverage.

The results obtained using the method described herein indicate that the concept of UPD can be applied to the stripping of atone layers of individual elements. Both for the reduction of Te to fore $Te^{2+}$ and for the oxidation of Cd to form $Cd^{2+}$, significantly different potentials are required to strip the bulk elements relative to the elements present in the form of the compound. By careful selection of stripping potentials, one can remove only the top atone layer of a given element. From the results in FIG. 3, a potential near $-1.0$ V can be used to strip an atone layer of Te, while a potential near $-0.1$ V can be used to strip an atone layer of Cd.

An alternate cell configuration for electrochemical digital etching is a thick layer cell, with effective convection, or a hydrodynamic cell where the electrolyte is continuously exchanged. The complexities of the TLE design and operation would be avoided with such cells.

Etching can be carried out with or without light present. Significant changes are observed in the background currents with the introduction of light. The pH of the solution used herein, pH 9, may be altered to achieve optimal etching. pH 9 was selected so that the hydrogen evolution reaction would not interfere with characterization of the Te reduction reaction. Problems associated with the Cd stripping reaction may occur due to the facile formation of $Cd(OH)_2$ at pH 9 ($k_{sp}=5.9\times10^{-15}$). Although the amount of $Cd^{2+}$ is quite small, the concentration is probably sufficient to initially cause formation of the hydroxide in the diffuse layer. Solutions buffered to lower pH values may be used to alleviate such problems.

The nature of the CdTe substrate may affect the etching process. For example, two crystallographic planes, the (111) and the (100), may have significant differences in reactivities, and the etching process may differ somewhat. Investigations into the substrate dependence need to include control over the surface crystallography of the substrate and the dopant density and carrier type. Control of the etching process for different crystallographies will alleviate such differences, and those skilled in the art should be able to control the process without undue experimentation.

The digital electrochemical etching of compound semiconductors is workable. The ease with which potentials can be changed makes electrochemistry very attractive for digital control over the etching process. That is, exchange of one etched species, electrons, for another, holes, is fast and complete.

A number of variables need to be considered to conduct the etching process, including: the stripping potentials; stripping times (a function of the dissolution kinetics and fluid flow); solution composition and pH; cell design; and substrate structure and doping. The present experiments were performed on CdTe in an aqueous solution. Other compounds also will work as well, such as GaAs, and the other compound semiconductors. Further, the use of nonaqueous etch solutions have advantages where relatively negative potentials are required, in order to avoid interference from the hydrogen evolution reaction.

The above description and examples are intended only for illustrative purposes of the best mode of the invention contemplated by the inventors, and those skilled in the art may identify variations or alterations without departing from the spirit of the invention which is defined by the following claims.

What is claimed is:

1. A method for the electrochemical etching of compound semiconductors which comprises alternating atomic layers of at least a first element and a second element, comprising the steps of:
    a. providing an electrochemical flow cell system which comprises a first electrode, a compound semiconductor comprising alternating layers of at least a first element and a second element, an electrolyte solution which can be actively flowed over said compound semiconductor, and a means for selecting and controlling the electrochemical potential across said electrochemical flow cell system, wherein said first electrode and the compound semiconductor are in electrochemical contact with each other by way of said electrolyte solution; and
    b. sequentially stripping layers of the first element and the second element from the compound semiconductor by selecting a first electrochemical potential sufficiently close to the upper or lower decomposition potential of the compound semiconductor to result in the removal of at least a portion of the atomic layer of the first element, leaving the atomic layer of the second element intact, and then selecting a second electrochemical potential sufficiently close to the lower or upper decomposition potential of the compound semiconductor to result in the removal of at least a portion of the atomic layer of the second element left after the removal of said portion of the atomic layer of the first element, wherein said first electrochemical potential is not sufficient to strip the second element from the semiconductor and said second electrochemical potential is not sufficient to strip the first element from the semiconductor.

2. The method as claimed in claim 1, wherein said step of sequentially stripping at least a portion of the atomic layer of the first element and at least a portion of the atomic layer of the second element from said semiconductor is repeated until the desired etched compound semiconductor is obtained.

3. The method as claimed in claim 2, wherein the first element is capable of being oxidized and the second element is capable of being reduced.

4. The method as claimed in claim 3, wherein said electrochemical etching involves applying a square wave where said first electrochemical potential is selected sufficiently positive so as to oxidize at least a portion of the atomic layer of the first element and said second electrochemical potential is selected sufficiently negative so as to reduce at least a portion of the atomic layer of the second element.

5. The method as claimed in claim 4, wherein there is a full complement of chemical bonds between a first portion of the first element and a first portion of the second element and there is not a full complement of chemical bonds between a second portion of the first element and a second portion of the second element, and said electrochemical etching occurs between said second portion of the first element and the second portion of the second element.

6. The method as claimed in claim 1, further comprising the step of actively flowing said electrolyte solution over said compound semiconductor to remove from the flow cell system any product ions of the first element and the second element etched from the semiconductor.

7. The method as claimed in claim 5, further comprising the step of actively flowing said electrolyte solution over said compound semiconductor to remove from the flow cell system any product ions of the first element and the second element etched from the semiconductor.

* * * * *